United States Patent [19]
Kitakado

[11] Patent Number: 5,929,486
[45] Date of Patent: Jul. 27, 1999

[54] CMOS DEVICE HAVING A REDUCED SHORT CHANNEL EFFECT

[75] Inventor: Hidehito Kitakado, Hyogo, Japan

[73] Assignee: Ricoh Company, Ltd., Tokyo, Japan

[21] Appl. No.: 08/956,290

[22] Filed: Oct. 23, 1997

[30] Foreign Application Priority Data

Oct. 25, 1996 [JP] Japan .................................... 8-301170

[51] Int. Cl.⁶ .............................. H01L 29/76; H01L 29/94
[52] U.S. Cl. ........................ 257/345; 257/327; 257/336; 257/338; 257/372
[58] Field of Search ..................... 257/338, 345, 257/372, 327, 336, 371, 408

[56] References Cited

U.S. PATENT DOCUMENTS

| | | | |
|---|---|---|---|
| 5,208,473 | 5/1993 | Komori et al. | 257/345 |
| 5,548,143 | 8/1996 | Lee | 257/345 |

FOREIGN PATENT DOCUMENTS

| | | | |
|---|---|---|---|
| 60-50960 | 3/1985 | Japan | 257/345 |
| 62-128175 | 6/1987 | Japan . | |
| 2-203566 | 8/1990 | Japan | 257/345 |
| 6-196642 | 7/1994 | Japan . | |

*Primary Examiner*—Jerome Jackson
*Assistant Examiner*—George C. Eckert
*Attorney, Agent, or Firm*—Dickstein Shapiro Morin & Oshinsky LLP

[57] ABSTRACT

A CMOS device includes a first MOS transistor of a surface channel type and a second MOS transistor of a buried channel type on a common substrate wherein a doped layer is provided underneath a first channel layer of the first MOS transistor and a second channel layer of the second MOS transistor, such that the first channel layer is provided at a level closer to a principal surface of the substrate as compared with source and drain regions of the first and second MOS transistors.

7 Claims, 7 Drawing Sheets

CMOS DEVICE HAVING A REDUCED SHORT CHANNEL EFFECT

BACKGROUND OF THE INVENTION

The present invention generally relates to semiconductor devices and more particularly to an improvement of a CMOS device.

A CMOS (complementary MOS) device is a semiconductor device in which a P-channel MOS transistor and an N-channel MOS transistor are provided on a common semiconductor substrate. Because of the high switching speed and low power consumption, a CMOS device is used extensively in various logic integrated circuit devices including a microprocessor.

In a CMOS device, a P-channel MOS transistor and an N-channel MOS transistor generally operate in a surface channel mode in which carriers are transported along a surface of a channel layer. On the other hand, there is proposed a buried channel CMOS device in which a channel is formed underneath a substrate surface.

FIG. 1 shows the construction of a conventional CMOS structure 10 disclosed in the Japanese Patent Publication 4-26790.

Referring to FIG. 1, the CMOS structure 10 is constructed on a p-type Si substrate 11 on which a P-channel MOS transistor 10A and an N-channel MOS transistor 10B are provided, with a field oxide film 11A intervening therebetween.

It should be noted that the P-channel MOS transistor 10A is provided on an N⁻-type surface region formed on the Si substrate 11 in correspondence to he region where the P-channel MOS transistor 10A is to be formed by way of a surface doping process and includes a polysilicon gate electrode 12A of the P⁺-type provided on the foregoing N⁻-type surface diffusion region 11f with a gate oxide film 13A intervening between the gate electrode 12A and the substrate surface. Further, the N-channel MOS transistor 10B is provided on a P⁺-type surface region 11g formed on the Si substrate 11 in correspondence to the region where the N-channel MOS transistor 10B is to be formed by way of a surface doping process and includes a polysilicon gate electrode 12B of the N⁺-type provided on the Si substrate 11 with a gate oxide film 13B intervening between the gate electrode 12B and the Si substrate 11 similarly to the gate oxide film 13A.

In the Si substrate 11, there are provided diffusion regions 11B and 11C of the P⁺-type at both lateral sides of the gate electrode 12A respectively as the source and drain regions of the P-channel MOS transistor 10A, with the N⁻-type surface region 11f extending therebetween as a surface channel region. Similarly, diffusion regions 11D and 11E of the N⁺-type are formed in the Si substrate 11 at both lateral sides of the gate electrode 12B respectively as the source and drain regions of the N-channel MOS transistor 10B, with the P⁺-type surface region 11g extending therebetween as a surface channel region. Further, both side walls of the gate electrode 12A are covered by side wall insulation films 12A₁ and 12A₂ and both side walls of the gate electrode 12B are covered by side wall insulation films 12B₁ and 12B₂.

Further, the P-channel MOS transistor 10A includes LDD (lightly doped-drain) regions 11b and 11c of the P⁺-type respectively as extensions of the diffusion region 11B and the diffusion region 11C. Similarly, the N-channel MOS transistor 10B includes LDD regions 11d and 11e of the N⁻-type respectively as extensions of the diffusion regions 11D and 11E.

In addition, the P-channel MOS transistor 10A includes a layer 14A of the P⁻ type bridging across the diffusion regions 11B and 11C at a level underneath the LDD regions 11b and 11c. Similarly, the N-channel MOS transistor 10B includes a layer 14B of the N⁻-type bridging across the diffusion regions 11D and 11E at a level underneath the LDD regions 11d and 11e. In the CMOS device 10 of FIG. 1, both the P-channel MOS transistor 10A and the N-channel MOS transistor 10B operate as a surface-channel MOS transistor.

By providing the layer 14A or 14B in such a surface-channel MOS transistor, the drain current of the MOS transistor 10A or 10B is increased substantially via the current path provided by the layer 14A or 14B. Associated with the formation of the foregoing current path through the layer 14A or 14B, the problem of hot-carrier injection into the gate oxide film, which tends to occur at a drain edge of the channel region 11f or 11g, is reduced substantially. Asced the layer 14A or 14B extends fully between the source and drain regions 11B and 11C or between the source and drain regions 11D and 11E, the short channel effect through the layer 14A or 14B is minimized.

On the other hand, the CMOS device of FIG. 1 has a drawback in that the polysi11con gate electrode pattern 12A of the P⁺-type for the P-channel MOS transistor 10A and the polysilicon gate electrode pattern 12B of the N⁺-type for the N-channel MOS transistor 10B have to be formed separately. When the polysilicon gate electrodes 12A and 12B have the same conductivity type such as the N-type or P-type, the threshold characteristics of the MOS transistor 10A or 10B may be modified unwontedly. Further, it is necessary to provide the N⁻-type surface diffusion region 11f in the Si substrate 11 selectively in correspondence to the region of the P-channel MOS transistor 10A. Similarly, it is necessary to provide the P⁻-type surface diffusion region 11g in the Si substrate 11 selectively in correspondence to the region of the N-channel MOS transistor 10B. Thereby, the number of the mask processes needed for forming the CMOS structure 10 is increased and hence the cost of the CMOS device. Further, it is necessary to form the layer 14A of the P⁻-type and the layer 14B of the N⁻-type separately by an ion implantation process, while such separately conducted ion implantation processes require additional costly mask processes.

Further, the conventional CMOS device 10 of FIG. 1 has a drawback in that the doped layer 14A of the P-channel MOS transistor 10A may induce a leakage current flowing into the interior of the substrate 11. When this occurs, a drain current is caused to flow even when the transistor 10A is turned off.

FIG. 2 shows another conventional CMOS structure 20 including a buried channel disclosed in the Japanese Laid-Open Patent Publication 6-196642.

Referring to FIG. 2, the CMOS structure 20 includes a P-channel MOS transistor 20A and an N-channel MOS transistor 20B provided commonly on an N-type Si substrate 21, wherein the P-channel MOS transistor 20A and the N-channel MOS transistor 20B are isolated from each other by a field oxide film 21A provided on the substrate 21.

In the structure of FIG. 2, the Si substrate 21 is formed with a P-type well 21W in correspondence to a part thereof in which the N-channel MOS transistor 20B is to be formed, and the surface of the P-type well 21W is covered by a gate oxide film 22B of the N-channel MOS transistor 20B. Further, a polysilicon gate electrode 23B of the N⁺-type is provided on the gate oxide film 22B in correspondence to a channel region 21G of the P-type. Similarly, a gate oxide film 22A is provided on the part of the N-type Si substrate 21 where the P-channel MOS transistor 20A is to be formed, and a polysilicon gate electrode 23A of the N⁺-type is provided on the gate oxide film 22A in correspondence to a channel region 21F of the P-type, which is formed by a surface doping process. The gate electrode 23A is laterally covered by a pair of side wall insulation films 23a. Similarly, the gate electrode 23B is laterally covered by a pair of side wall insulation films 23b.

At both lateral sides of the gate electrode 23A, diffusion regions 21B and 21C of the P⁺-type are formed in the substrate 21 as source and drain regions of the P-channel MOS transistor 20A respectively, wherein the diffusion regions 21B and 21C are provided at the outer sides of the side wall insulation films 23a as usual in the art of MOS transistor. Further, an LDD region 21b of the P⁻-type is formed in the substrate 21 between the diffusion region 21B and the P-type channel region 21F, and an LDD region 21c also of the P⁻-type is formed between the diffusion region 21C and the P-type channel region 21F.

Similarly, diffusion regions 21D and 21E of the N⁺-type are formed in the P-type well 21W at both lateral sides of the gate electrode 23B, and an LDD region 21d of the N⁻-type is provided in the well 21W between the diffusion region 21D and the P-type channel region 21G. Further, an LDD region 21e of the N⁻-type is provided between the diffusion region 21E and the P-type channel region 21G.

Thereby, it will be noted that the N-channel MOS transistor 20B operates as an ordinary surface-channel MOS transistor, while the P-channel MOS transistor 20A operates as a buried-channel MOS transistor in which the channel is formed in the interior of the channel layer 22A at a level slightly offset from the surface of the substrate 21.

Further, the P-channel MOS transistor 20A is provided with an N-type layer 24A underneath the P-type channel region 21F, wherein the N-type layer 24A restricts the carrier path extending from the source region 21B to the drain region 21C via the LDD region 21b, the channel region 21F and the LDD region 21c, all having the P-type conductivity type, by inducing a depletion region at the P-N interface between the buried channel layer 24A and the channel region 21F. Thereby, the impurity concentration level of the buried channel layer 24A is set so that the P-channel MOS transistor 20A has a desired threshold voltage. The N-type layer 24A also suppresses the short channel effect.

Further, the N-channel MOS transistor 20B includes an N-type layer 24B underneath the source and drain regions 21D and 21E so as to extend continuously between the source and drain regions 21D and 21E. The N-type layer 24B has an impurity concentration level smaller than the impurity concentration level in the source region 21D or the drain region 21E of the N⁺-type and effectively reduces the junction capacitance formed between the substrate 21 and the source region 21D or the drain region 21E.

As the CMOS structure of FIG. 2 uses an N⁺-type polysilicon pattern commonly for the gate electrode 23A and the gate electrode 23B, the gate electrode 23A and the gate electrode 23B can be formed simultaneously. Further, the P-type layer 21F and the P-type layer 21G can be formed simultaneously by a common surface doping process. Further, the N-type layer 24A and the N-type layer 24B are formed simultaneously by a common ion implantation process. Thereby, the CMOS structure 20 of FIG. 2 can be formed easily and efficiently as compared with the structure of FIG. 1.

In the construction of FIG. 2, it is desired to provide the N-type layer 24A at a level or depth as close as possible to the top surface of the substrate 21 in the P-channel MOS transistor 20A in order to suppress the short channel effect and to control the threshold voltage of the P-channel MOS transistor 20A. On the other hand, in the N-channel MOS transistor 20B, it is necessary and desired to provide the N-channel layer 24B at the bottom level of the diffusion regions 21D and 21E for minimizing the junction capacitance at the drain regions 21D and 21E.

Thus, as long as the layer 24A and the layer 24B are to be formed simultaneously by a common process, it is necessary to form the buried N-type layer 24A also at the bottom level of the source and drain regions 21B and 21C, and the desired effect of suppressing the short channel effect or the control of the threshold voltage in the P-channel MOS transistor 20A cannot be achieved. Generally, it is difficult to reduce the depth of the N-type diffusion region below about 100 μm. Further, the N-type layer 24B of the N-channel MOS transistor 20B, provided underneath the source and drain regions 21D and 21E, does not contribute to the suppressing of the short channel effect.

SUMMARY OF THE INVENTION

Accordingly, it is a general object of the present invention to provide a novel and useful CMOS device wherein the foregoing problems are eliminated.

Another and more specific object of the present invention is to provide a CMOS device capable of suppressing short channel effect and simultaneously having a structure suitable for production with a reduced cost.

Another object of the present invention is to provide a CMOS device in which the drain current is increased and the hot-carrier resistance is improved in an N-channel MOS transistor without deteriorating the short-channel effect thereof and in which the short-channnel effect is effectively suppressed in a P-channel MOS transistor which form the CMOS device together with the N-channel MOS transistor.

Another object of the present invention is to provide a CMOS device, comprising:

a substrate;

a first metal-oxide-semiconductor transistor provided on a first area of said substrate; and a second metal-oxide-semiconductor transistor provided on a second, different area of said substrate;

said first metal-oxide-semiconductor transistor including: a first channel region defined in said substrate in correspondence to said first area; a first gate electrode of a first conductivity type provided on said first area of said substrate; and source and drain regions both of said first conductivity type and formed in said substrate in correspondence to said first area at both lateral sides of said first channel region;

said second metal-oxide-semiconductor transistor including: a second channel region defined in said substrate in correspondence to said second area; a second gate electrode of said first conductivity type provided on said second area of said substrate; and source and drains both of a second, opposite conductivity type formed in said substrate in correspondence to said second area at both lateral sides of said second channel region;

said first channel layer including a lower layer of said first conductivity type and an upper layer of said second conductivity type, said lower layer of said first conductivity type containing an impurity element of said first conductivity type;

said second channel layer including a lower layer of said first conductivity type and an upper layer of said second conductivity type;

said lower layer of said first channel layer being provided such that a maximum concentration of said impurity element in said lower layer of said first channel layer is located at a level closer to a principal surface of said substrate with respect to a junction depth of said source and drain regions of said first metal-oxide-semiconductor transistor at a part underneath said first gate electrode.

According to the present invention, it is possible to form the polysilicon gate of the first and second MOS transistors simultaneously by patterning a common polysilicon layer doped to the first conductivity type. Further, the upper channel layer of the first MOS transistor and the upper channel layer of the second MOS transistor are formed simultaneously by applying a surface doping process by using a second conductivity dopant. In addition, the lower layer of the first MOS transistor and the lower layer of the second MOS transistor can be formed simultaneously.

Further, the problem of short channel effect, which arises particularly in the second MOS transistor operating in the buried channel mode, is successfully suppressed by forming the lower layer of the first conductivity type close to the substrate principal surface. Further, the drain current of the first MOS transistor is increased substantially as a result of use of the lower layer of the first conductivity type also in the first MOS transistor.

Other objects and further features of the present invention will become apparent from the following detailed description when read in conjunction with the attache drawings.

DETAILED DESCRIPTION OF THE PREFERRED EMBODIMENTS

Figure 3:
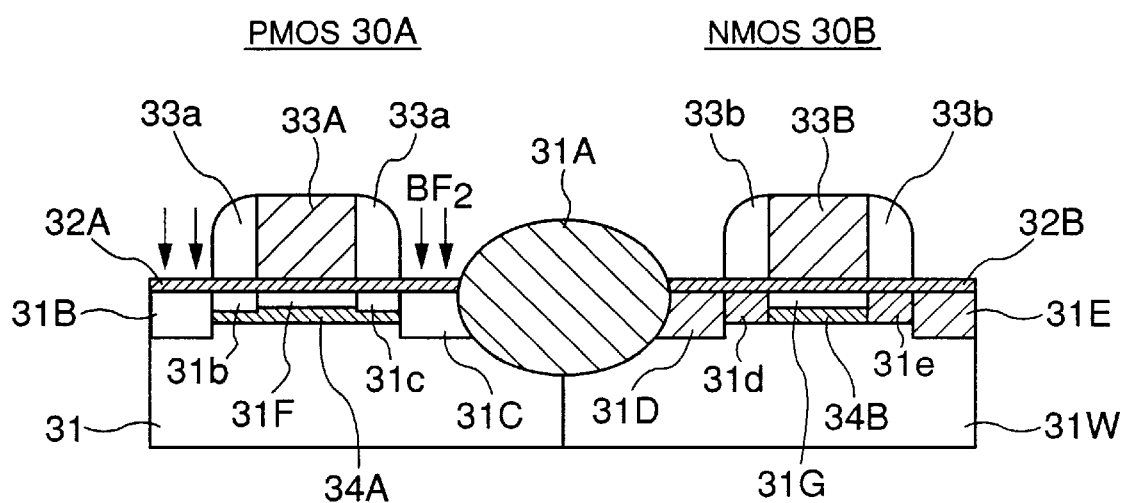
FIG. 3 is a diagram showing the construction of a CMOS device according to an embodiment of the present invention.

FIG. 3 shows a CMOS structure 30 according to an embodiment of the present invention.

Referring to FIG. 3, the CMOS structure 30 includes a P-channel MOS transistor 30A and an N-channel MOS transistor 30B provided commonly on an N-type Si substrate 31, wherein the P-channel MOS transistor 30A and the N-channel MOS transistor 30B are isolated from each other by a field oxide film 31A provided on the substrate 31.

In the structure of FIG. 3, the Si substrate 31 is formed with a P-type well 31W in correspondence to a part thereof in which the N-channel MOS transistor 30B is to be formed, and the surface of the P-type well 31W is covered by a gate oxide film 32B of the N-channel MOS transistor 30B.

Further, a polysilicon gate electrode 33B of the $N^+$-type is provided on the gate oxide film 32B in correspondence to a channel region 31G of the P-type. Similarly, a gate oxide film 32A is provided on the part of the N-type Si substrate 31 where the P-channel MOS transistor 30A is to be formed, and a polysilicon gate electrode 33A of the $N^+$-type is provided on the gate oxide film 32A in correspondence to a channel region 31F of the P-type, which is formed by a surface doping process. The gate electrode 33A is laterally covered by a pair of side wall insulation films 33a. Similarly, the gate electrode 33B is laterally covered by a pair of side wall insulation films 33b.

At both lateral sides of the gate electrode 33A, diffusion regions 31B and 31C of the $P^+$-type are formed in the substrate 31 as source and drain regions of the P-channel MOS transistor 30A respectively, wherein the diffusion regions 31B and 31C are provided at the outer sides of the side wall insulation films 33a as usual in the art of MOS transistor. Further, an LDD region 31b of the $P^-$-type is formed in the substrate 31 between the diffusion region 31B and the P-type channel region 31F, and an LDD region 31c also of the $P^-$-type is formed between the diffusion region 31C and the P-type channel region 31F.

Similarly, diffusion regions 31D and 31E of the $N^+$-type are formed in the P-type well 31W at both lateral sides of the gate electrode 33B, and an LDD region 31d of the $N^-$-type is provided in the well 31W between the diffusion region 31D and the P-type channel region 31G. Further, an LDD region 31e of the $N^-$-type is provided between the diffusion region 31E and the P-type channel region 31G.

Thereby, it will be noted that the N-channel MOS transistor 30B operates in a surface-channel mode, while the P-channel MOS transistor 30A operates in a buried-channel mode in which the channel of carriers is formed in the interior of the channel layer 31F at a level slightly offset from the surface of the substrate 31.

Further, the P-channel MOS transistor 30A is provided with an N-type layer 34A underneath the P-type channel region 31F at a level above the bottom level of the diffusion regions 31B and 31C, wherein the N-type layer 34A restricts the carrier path extending from the source region 31B to the drain region 31C via the LDD region 31b, the channel region 31F and the LDD region 31c, all having the P-type conductivity type, by inducing a depletion region at the P-N interface between the channel layer 34A and the channel region 31F.

Preferably, the N-type layer 34A is provided at a level as close to the top principal surface of the substrate 31 as possible for suppressing the short channel effect in the P-channel MOS transistor 30A. On the other hand, in view of the reasons to be explained later, the layer 34A is provided at an optimum level of 50–100 nm as measured from the top principal surface of the substrate 31. Further, the N-type layer 34A may have an optimum impurity concentration level of $1\times10^{17}$–$5\times10^{17}$ $cm^{-3}$.

Further, the N-channel MOS transistor 30B includes a similar N-type layer 34B underneath the source and drain regions 31D and 31E so as to extend continuously between the source and drain regions 31D and 31E. The N-type layer 34B may be formed simultaneously to the N-type layer 34A by an ion implantation process and may be formed at the foregoing depth of 50–100 nm as measured from the top surface of the substrate 31. At this depth, the bottom of the N-type layer 34B substantially coincides with the bottom level of the LDD regions 31d and 31e. Further, the N-type layer 34B may be doped to the foregoing optimum impurity concentration level of $1\times10^{17}$–$5\times10^{17}$ $cm^{-3}$.

Figure 1:
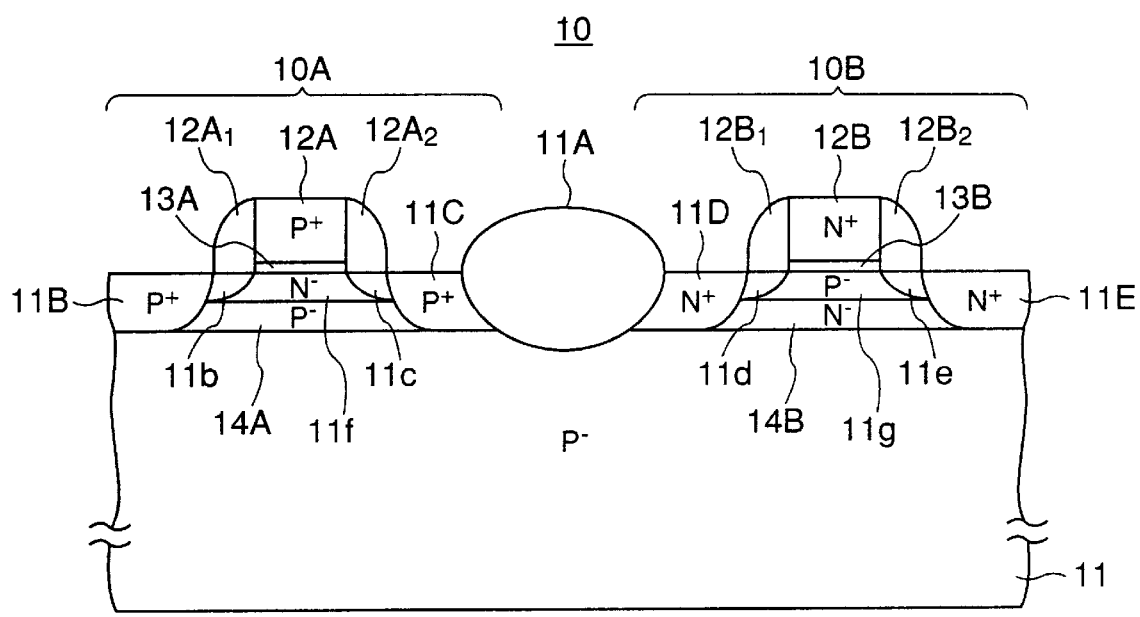
FIG. 1 is a diagram showing the construction of a conventional CMOS device.
Figure 2:
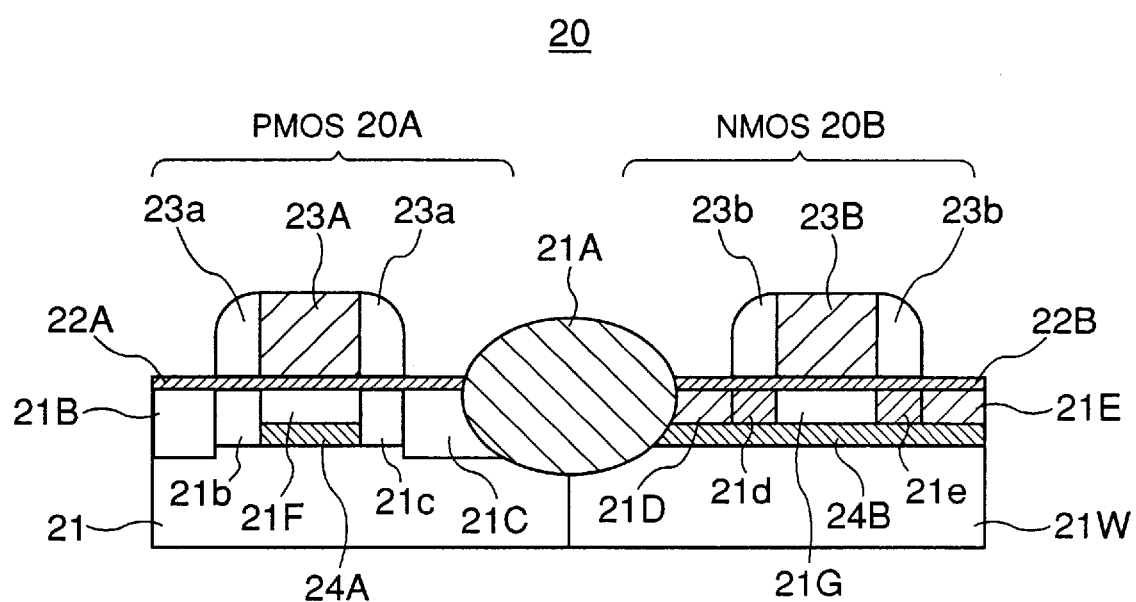
FIG. 2 is a diagram showing the construction of another conventional CMOS device.

As the CMOS structure of FIG. 3 uses an N⁺-type polysilicon pattern commonly for the gate electrode 33A and the gate electrode 33B, the gate electrode 33A and the gate electrode 33B can be formed simultaneously. Further, the P-type layer 31F and the P-type layer 31G can be formed simultaneously by a common surface doping process. Further, the N-type layer 34A and the N-type layer 34B are formed simultaneously by a common ion implantation process. Thereby, the CMOS structure 30 of FIG. 3 can be formed easily and efficiently similarly to the structure of FIG. 2.

FIGS. 4A–4E show the fabrication process of the CMOS device 30 of FIG. 3.

Figure 4A:
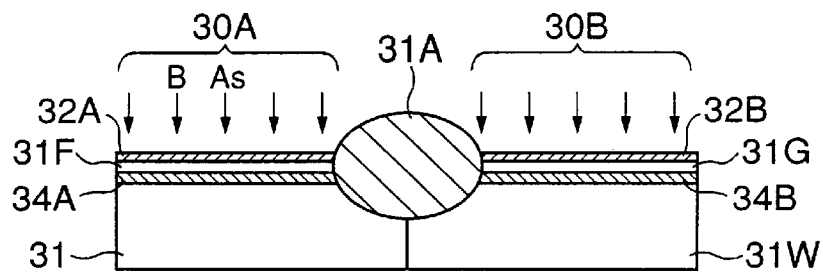
FIGS. 4A–4E are diagrams showing a fabriation process of the CMOS device of FIG. 3.

Referring to FIG. 4A, the P-type well 31W is formed in the Si substrate 31, followed by a formation of the field oxide film 31A in correspondence to the boundary of the P-type well 31W by a wet oxidization process. Further, the gate oxide films 32A and 32B are formed by a thermal oxidation process simultaneously with a thickness of about 10 nm. After the formation of the gate oxide films 32A and 32B, an ion implantation of B is conducted on the substrate 31 with an acceleration energy of 10 keV and a dose of $5 \times 10^{12}$–$8 \times 10^{12}$ cm$^{-2}$ and the channel layers 31F and 31G are formed respectively in the region of the P-channel MOS transistor 30A and in the region of the N-channel MOS transistor 30B respectively. Further, an ion implantation of As is conducted on the substrate 31 with an acceleration energy of 150 keV and a dose of $5 \times 10^{11}$–$2 \times 10^{12}$ cm$^{-2}$ to form the N-type layers 34A and 34B. By setting the acceleration voltage to about 150 keV, it is possible to form the N-type layers 34A and 34B such that the maximum concentration of As in the layer 34A or 34B appears at the depth of about 75 nm as measured from the top principal surface of the Si substrate 31.

Figure 4B:
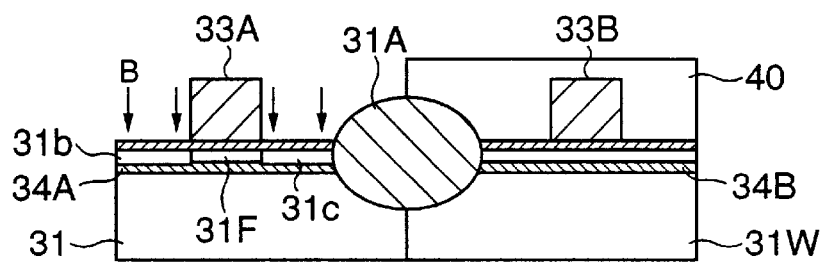

Next, in the step of FIG. 4B, the polysilicon gate patterns 33A and 33B are formed respectively on the device region of the P-channel MOS transistor 30A and on the device region of the N-channel MOS transistor 30B. After the formation of the gate patterns 33A and 33B, the device region of the N-channel MOS transistor 30B is covered by a photoresist, and an ion implantation of B is conducted into the device region of the P-channel MOS transistor 30A with an acceleration voltage of 10 keV and a dose of $5 \times 10^{12}$–$1 \times 10^{13}$ cm$^{-2}$. Thereby, the LDD regions 31b and 31c are formed. As it is desired that the LDD regions 31b and 31c are formed only at a very shallow part of the substrate 31, it is preferable to conduct an ion implantation of As or P when forming the LDD regions 31b and 31c at a deeper level by using an acceleration voltage of 150 keV and a dose of $5 \times 10^{12}$–$1 \times 10^{13}$ cm$^{-2}$. Thus, the existence of the N-type layer 34A contributes to the formation of the shallow LDD regions 31b and 31c.

In the structure of FIG. 4B, it should be noted that the LDD regions 31b and 31c are formed at a level above the N-type layer 34A formed previously in the step of FIG. 4A for suppressing the short channel effect.

Figure 4C:
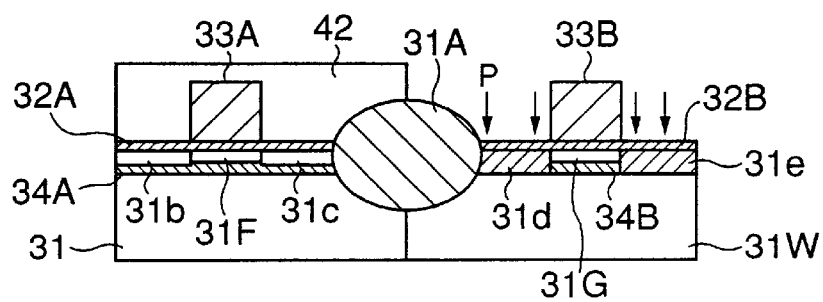

Next, in the step of FIG. 4C, the region of the P-channel MOS transistor 30A is covered by a resist 42, and an ion implantation of P is conducted with an acceleration voltage of 10 keV and a dose of $1 \times 10^{13}$–$3 \times 10^{13}$ cm$^{-2}$. Thereby, the LDD regions 31d and 31e are formed in the device region of the N-channel MOS transistor 30B such that the bottom of the LDD-regions 31d and 31e is located generally coincident to the bottom of the N-type layer 34B or lower.

Figure 4D:
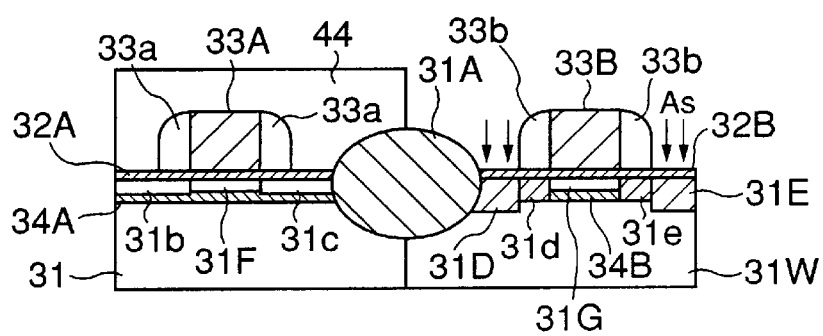

Next, in the step of FIG. 4D, the side wall insulation films 33a and 33b are provided respectively on the gate electrode patterns 33A and 33B, and an ion implantation process of P is conducted, after covering the device region of the P-channel MOS transistor 30A by a resist 44, into the P-type well 31W with an acceleration voltage of 50 keV and a dose of $3 \times 10^{15}$–$5 \times 10^{15}$ cm$^{-2}$ to form the source and drain regions 31D and 31E, wherein it should be noted that the source and drain regions 31D and 31E are formed with a depth substantially deeper than the depth of the N-type layer 34B.

Figure 4E:
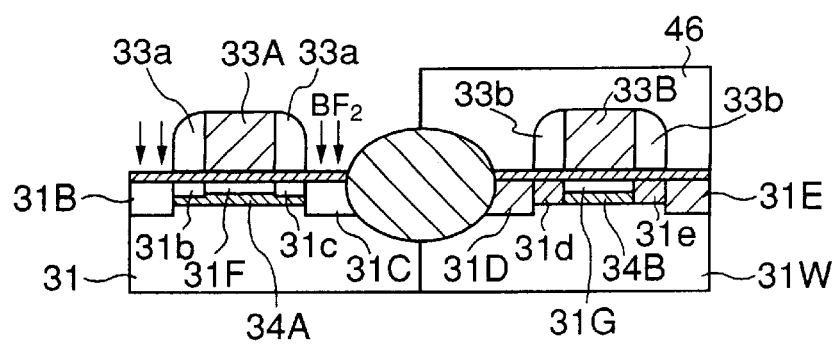

Further, in the step of FIG. 4E, the device region of the N-channel MOS transistor 30B is covered by a resist 46, and an ion implantation process of BF₂ is conducted to form the source and drain regions 31B and 31C at the level below the N-type layer 34A. The step of FIG. 4D and the step of FIG. 4E may be interchanged.

Figure 5A:
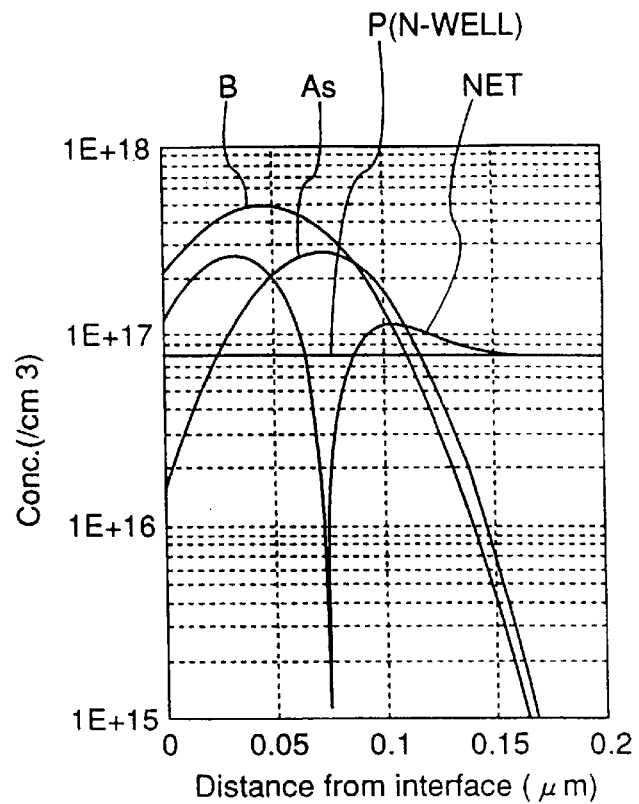
FIGS. 5A and 5B and are diagrams showing the distribution profile of impurity elements injected into a Si substrate by an ion implantation process.
Figure 5B:
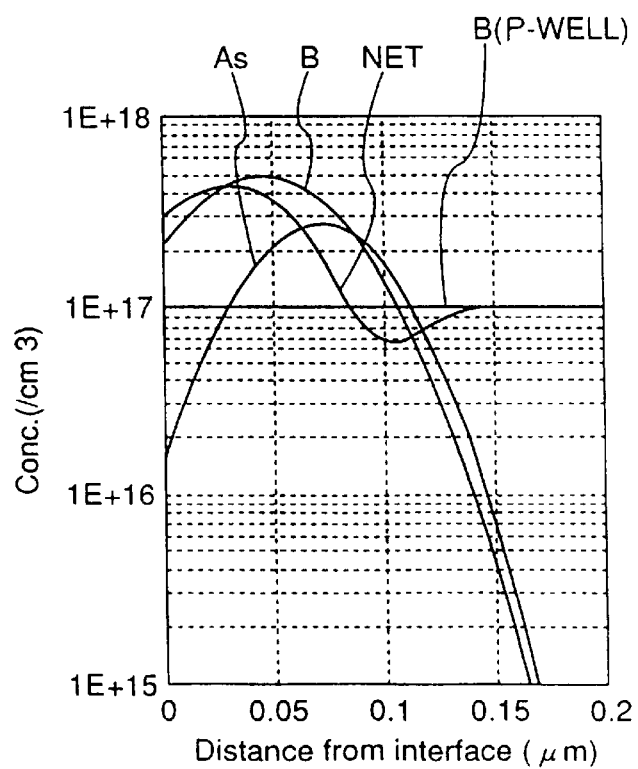

FIGS. 5A and 5B show the concentration profile of various impurity elements respectively in the N-type substrate 31 (N-well) doped uniformly by P and in the P-type well 31W doped uniformly by B respectively.

Referring to FIG. 5A, it can be seen that the As atoms forming the layer 34A are distributed with a maximum concentration level generally at a depth of 50–100 nm as measured from the top surface of the substrate 31. Further, it can be seen that the B atoms forming the channel layer 31F are distributed with a peak of concentration located at a level shallower than the level of the peak concentration of the As atoms forming the N-type layer 34A. FIG. 5A also shows a net carrier concentration profile realized in the N-type well.

Further, FIG. 5B shows the distribution profile of the impurity elements in the P-type well 31W doped uniformly by B, wherein it can be seen that the As atoms forming the N-type layer 34B are distributed with a concentration peak located somewhere between about 50 nm and about 100 nm as measured from the top surface of the substrate 31 similarly to the case of FIG. 5A. Further, the B atoms forming the channel layer 31G are distributed with a concentration peak located at a shallower level than the concentration peak of the As atoms forming the N-type layer 34B.

Figure 6A:
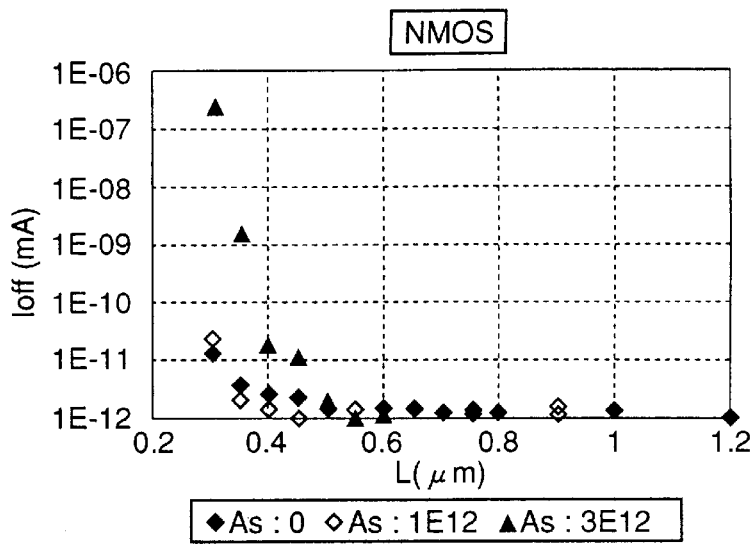
FIGS. 6A–6C are diagrams showing various operational characteristics of the CMOS device of FIG. 3.

FIG. 6A shows the leakage current observed for various samples of the N-channel MOS transistor 30B formed with various channel lengths L.

Figure 6B:
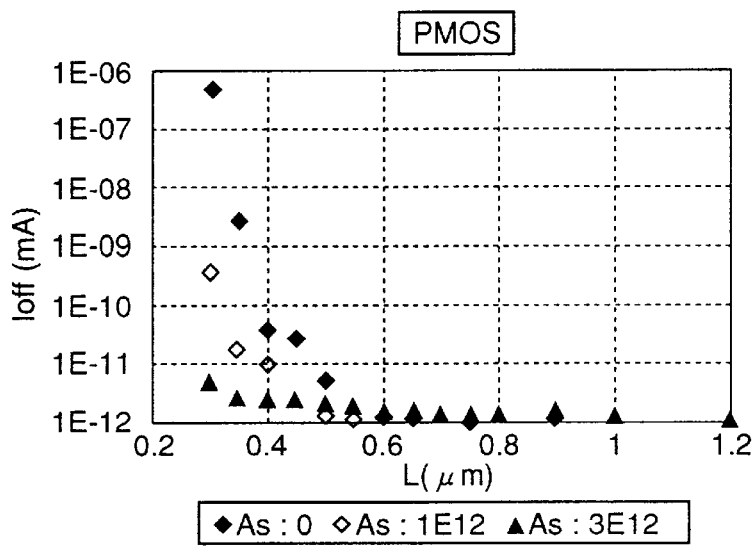

Referring to FIG. 6A, it can be seen that the leakage current is minimum when no N-type layer 34B is formed in the N-channel MOS transistor 30B or when the As dose in the layer 34B is set to a level not exceeding the level of about $1 \times 10^{12}$ cm$^{-2}$. When the As dose in the layer 34B is increased to the level of $3 \times 10^{12}$ cm$^{-2}$ or more, it can be seen that the leakage current Ioff increases sharply when the gate length L is reduced below about 0.4 μm On the other hand, FIG. 6B shows a tendency that the leakage current Ioff of the P-channel MOS transistor 30A increases sharply when the gate length is reduced below about 0.4 μm. FIG. 6B further indicates that the increase of the leakage current Ioff of the P-channel MOS transistor 30A is effectively suppressed by providing the N-type layer 34A with an As dose of $1 \times 10^{12}$ cm$^{-2}$ or more.

In view of the trade-off relationship of FIG. 6A and FIG. 6B, it is concluded that the N-type layers 34A and 34B of the CMOS device 30 of the present invention should have an optimum impurity concentration level for the N-type dopant in the range of $1 \times 10^{17}$–$5 \times 10^{13}$ cm$^{-3}$, for suppressing the leakage current Ioff in each of the P-channel MOS transistor 30A and the N-channel MOS transistor 30B simultaneously.

Figure 6C:
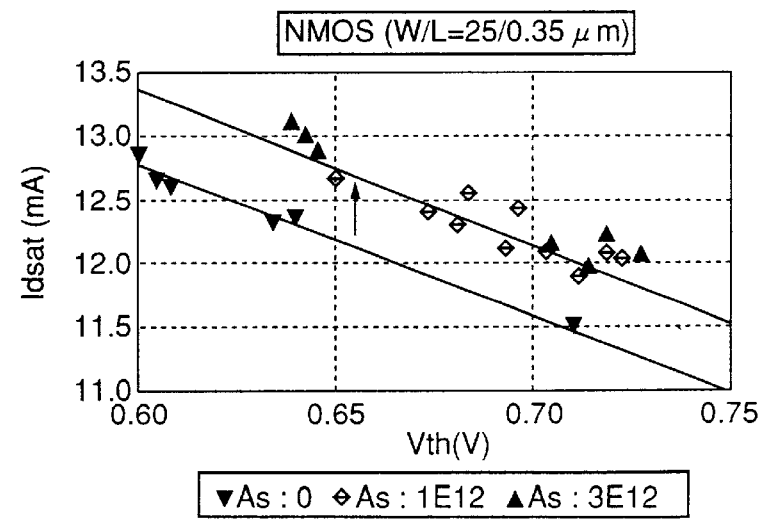

FIG. 6C shows the relationship between the drain current Idsat and the threshold voltage Vth of the N-channel MOS transistor 30B for various dopant levels used for forming the N-type layer 34B.

Referring to FIG. 6C, it will be noted that the drain current increases with the formation of the N-type layer 34B as indicated by an arrow, indicating that the N-type layer 34B acts as a channel of the carriers. It should be noted that the data of FIG. 6C is for an N-channel MOS transistor 30B having a channel width W of 25 μm and a channel length L of 0.35 μm.

Figure 7:
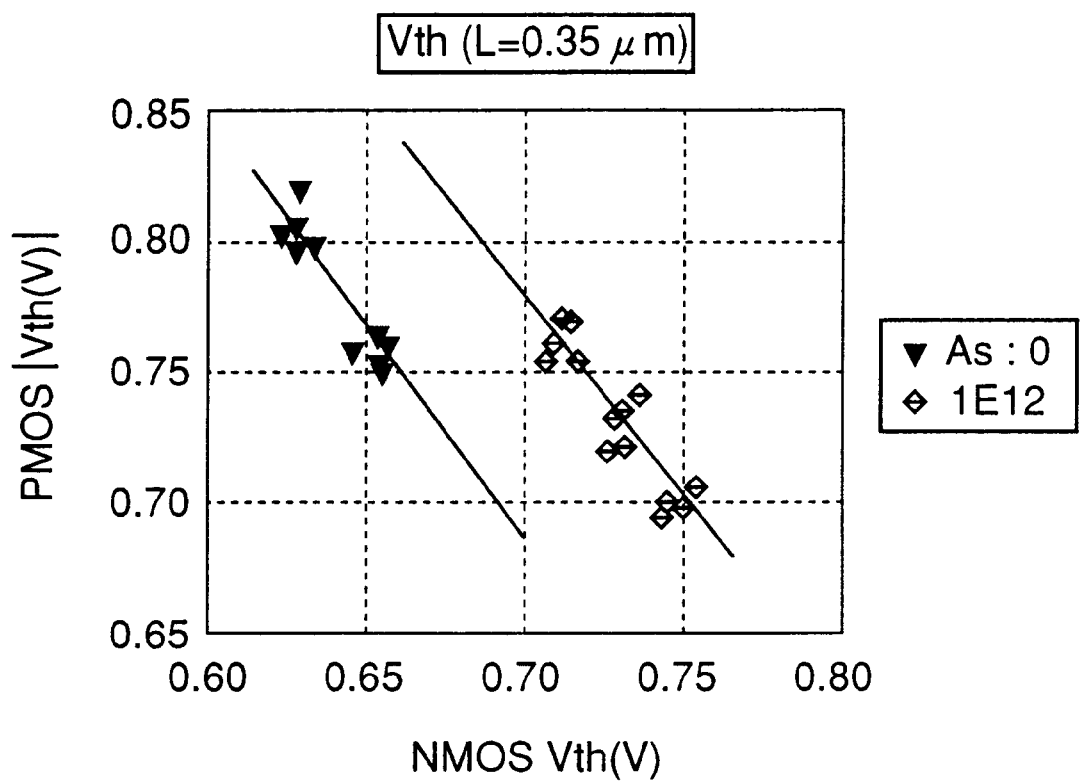
FIG. 7 is a iagram showing the threshold characteristics of the CMOS device of FIG. 3.

FIG. 7 shows the modification of the threshold voltage in the P-channel MOS transistor 30A and in the N-channel MOS transistor 30B as a result of formation of the N-type layers 34A and 34B, wherein the vertical axis represents the absolute value of the threshold voltage Vth (|Vth|) of the P-channel MOS transistor 30A while the horizontal axis represents the threshold voltage Vth of the N-channel MOS transistor 30B.

As can be seen, there is a tendency that both the threshold voltage |Vth| of the P-channel MOS transistor 30A and the threshold voltage Vth of the N-channel MOS transistor 30B are increased as a result of the formation of the N-type layer 34A or 34B. On the other hand, the magnitude of the change is relatively small and the CMOS device 30 of the present invention shows an excellent performance.

Further, the present invention is not limited to the embodiments described heretofore, but various variations and modifications may be made without departing from the scope of the invention.

What is claimed is:

1. A complementary-metal-oxide-semiconductor device, comprising:
    a substrate;
    a first metal-oxide-semiconductor transistor provided on a first area of said substrate; and
    a second metal-oxide-semiconductor transistor provided on a second, different area of said substrate;
    said first metal-oxide-semiconductor transistor including: a first channel region defined in said substrate in correspondence to said first area; a first gate electrode of a first conductivity type provided on said first area of said substrate; and source and drain regions both of said first conductivity type and formed in said substrate in correspondence to said first area at both lateral sides of said first channel region, said source and drain regions extending a first depth as measured from a principal surface of said substrate;
    said second metal-oxide-semiconductor transistor including: a second channel region defined in said substrate in correspondence to said second area; a second gate electrode of said first conductivity type provided on said second area of said substrate; and source and drain regions both of a second, opposite conductivity type formed in said substrate in correspondence to said second area at both lateral sides of said second channel region, said source and drain regions of said second metal-oxide-semiconductor transistor extending a second depth as measured from said principal surface of said substrate;
    said first channel region including a lower layer of said first conductivity type and an upper layer of said second conductivity type, said lower layer of said first conductivity type containing an impurity element of said first conductivity type;
    said second channel region including a lower layer of said first conductivity type and an upper layer of said second conductivity type;
    said lower layer of said first channel region being provided such that a maximum concentration of said impurity element in said lower layer of said first channel region is located closer to said principal surface of said substrate with respect to said first depth of said source and drain regions of said first metal-oxide-semiconductor transistor at a part underneath said first gate electrode.

2. A complementary-metal-oxide-semiconductor device as claimed in claim 1, wherein said lower layer of said first channel region and said lower layer of said second channel region are formed at a substantially identical depth as measured from said principal surface of said substrate.

3. A complementary-metal-oxide-semiconductor device as claimed in claim 2, wherein said lower layer of said second channel region is provided closer to said principal surface of said substrate with respect to said second depth of said source and drain regions of said second metal-oxide-semiconductor transistor.

4. A complementary-metal-oxide-semiconductor device as claimed in claim 1, wherein said first metal-oxide-semiconductor transistor includes a first lightly doped diffusion region in said substrate between said source region of said first metal-oxide-semiconductor transistor and said first channel region and a second lightly doped diffusion region in said substrate between said drain region of said first metal-oxide-semiconductor transistor and said first channel region, said first and second lightly doped diffusion regions extending a third depth as measured from said principal surface of said substrate, and wherein said lower layer of said first channel region is provided such that said maximum of said impurity element is located closer to said principal surface of said substrate with respect to said third depth of said first and second lightly doped diffusion regions underneath said first gate electrode.

5. A complementary-metal-oxide-semiconductor device as claimed in claim 4, wherein said second metal-oxide-semiconductor transistor includes a third lightly doped diffusion region in said substrate between said source region of said second metal-oxide-semiconductor transistor and said second channel region and a fourth lightly doped diffusion region in said substrate between said drain region of said second metal-oxide-semiconductor transistor and said second channel region, said third and fourth lightly doped diffusion regions extending a fourth depth as measured from said principal surface of said substrate, and wherein said lower layer of said second channel region contains a second impurity element of said first conductivity type such that a maximum of said second impurity element in said lower layer of said second channel region is located deeper than said fourth depth of said third and fourth lightly doped diffusion regions at a part underneath said second gate electrode.

6. A complementary-metal-oxide-semiconductor device as claimed in claim 1, wherein said lower layer of said first channel region and said lower layer of said second channel region are provided such that each of said lower layer of said first channel region and said lower layer of said second channel region has a maximum of impurity concentration at a depth between about 50 nm and about 100 nm as measured from said principal surface of said substrate.

7. A complementary-metal-oxide-semiconductor device as claimed in claim 6, wherein each of said lower layer of said first channel region and said lower layer of said second channel region has an impurity concentration level in a range between about $1 \times 10^{17}$ and about $5 \times 10^{17}$ cm$^{-3}$.

* * * * *